(12) United States Patent
Lindner

(10) Patent No.: US 10,971,378 B2
(45) Date of Patent: Apr. 6, 2021

(54) METHOD AND DEVICE FOR BONDING SUBSTRATES

(71) Applicant: EV Group E. Thallner GmbH, St. Florian am Inn (AT)

(72) Inventor: Friedrich Paul Lindner, Scharding (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 163 days.

(21) Appl. No.: 15/992,274

(22) Filed: May 30, 2018

(65) Prior Publication Data

US 2018/0277403 A1 Sep. 27, 2018

Related U.S. Application Data

(63) Continuation of application No. 15/110,417, filed as application No. PCT/EP2014/052037 on Feb. 3, 2014, now Pat. No. 10,014,193.

(51) Int. Cl.
*H01L 21/67* (2006.01)
*H01L 21/687* (2006.01)

(52) U.S. Cl.
CPC .. *H01L 21/67092* (2013.01); *H01L 21/67103* (2013.01); *H01L 21/67109* (2013.01); *H01L 21/67248* (2013.01); *H01L 21/68707* (2013.01)

(58) Field of Classification Search
CPC ......... H01L 21/68707; H01L 21/67248; H01L 21/67109; H01L 21/67103; H01L 21/67092
See application file for complete search history.

(56) References Cited

U.S. PATENT DOCUMENTS

| 6,960,743 | B2 | 11/2005 | Hiramatsu et al. |
| 7,959,400 | B2 | 6/2011 | Hagio et al. |
| 2004/0117977 | A1* | 6/2004 | Hiramatsu ........ H01L 21/67103 29/611 |
| 2004/0218339 | A1* | 11/2004 | Nakamura .......... H01L 21/6831 361/234 |
| 2007/0194005 | A1 | 8/2007 | Hirakawa et al. |
| 2008/0095600 | A1 | 4/2008 | Hagio et al. |
| 2011/0309647 | A1 | 12/2011 | Yang et al. |
| 2012/0247645 | A1 | 10/2012 | Tsutsumi et al. |
| 2012/0304921 | A1 | 12/2012 | Miyamoto et al. |

(Continued)

FOREIGN PATENT DOCUMENTS

| EP | 1 341 216 A1 | 9/2003 |
| JP | 2002-237375 A | 8/2002 |

(Continued)

OTHER PUBLICATIONS

Machine Translation of JP-2009141043-A (Year: 2009).*

(Continued)

*Primary Examiner* — Daniel McNally
(74) *Attorney, Agent, or Firm* — Kusner & Jaffe

(57) ABSTRACT

A method and corresponding device for bonding a first contact surface of a first substrate to a second contact surface of a second substrate. The method includes the steps of arranging a substrate stack, formed from the first substrate and the second substrate and aligned on the contact surfaces, between a first heating surface of a first heating system and a second heating surface of a second heating system.

7 Claims, 11 Drawing Sheets

(56) References Cited

U.S. PATENT DOCUMENTS

| | | |
|---|---|---|
| 2012/0318856 A1 | 12/2012 | Hirakawa |
| 2015/0210057 A1 | 7/2015 | Wagenleithner et al. |
| 2016/0020136 A1 | 1/2016 | Thallner et al. |
| 2016/0126085 A1 | 5/2016 | Schmidbauer et al. |
| 2016/0148826 A1 | 5/2016 | Thallner |

FOREIGN PATENT DOCUMENTS

| | | | |
|---|---|---|---|
| JP | 2004-119554 A | | 4/2004 |
| JP | 2007-201068 A | | 8/2007 |
| JP | 2008-103544 A | | 5/2008 |
| JP | 2008-140949 A | | 6/2008 |
| JP | 2009-141043 A | | 6/2009 |
| JP | 2009141043 A | * | 6/2009 |
| JP | 2011-114278 A | | 6/2011 |
| WO | WO 2012/030703 A2 | | 3/2012 |
| WO | WO-2014/154272 A1 | | 10/2014 |
| WO | WO-2014/191033 A1 | | 12/2014 |
| WO | WO-2014/202106 A1 | | 12/2014 |
| WO | WO-2015/000520 A1 | | 1/2015 |
| WO | WO-2015/082020 A1 | | 6/2015 |

OTHER PUBLICATIONS

International Search Report from corresponding International Patent Application No. PCT/EP2014/052037, dated Apr. 3, 2014.
Office Action issued in related U.S. Appl. No. 15/110,417 dated Jul. 7, 2017.
Office Action issued in related U.S. Appl. No. 15/110,417 dated Dec. 6, 2017.

* cited by examiner

Sectional View A-A

METHOD AND DEVICE FOR BONDING SUBSTRATES

RELATED APPLICATIONS

This application is a continuation of U.S. application Ser. No. 15/110,417, filed Jul. 8, 2016, which is a U.S. National Stage of International Application No. PCT/EP2014/052037, filed Feb. 3, 2014, said patent application hereby fully incorporated herein by reference.

FIELD OF INVENTION

This invention relates to a method for bonding a first contact surface of a first substrate with a second contact surface of a second substrate as well as a corresponding device.

BACKGROUND OF THE INVENTION

Alignment systems are known in which the alignment of the substrates with one another takes place under a normal atmosphere. The substrates that are aligned with one another are still temporarily attached to one another in the alignment system and are subsequently transferred to a high-vacuum bonding system and permanently bonded there under vacuum, whereby the temperature that is necessary for bonding is produced by heat sources.

The heat sources together with corresponding pressure plates are located above or below the substrates that are to be bonded. The upper heat source and the upper pressure plate are designed to be movable. The lower heat source and the specimen holder on the bottom of the high-vacuum bonding system are designed statically.

In the alignment system, the two substrates that are to be aligned with one another are attached to a bond chuck. In this case, the attachment is carried out in most cases with mechanical clamps. The substrates that are received in the bond chuck and are aligned with one another are then transported to the high-vacuum bonding system. The bond chuck is laid down on the lower heat source.

Because of the structures that are becoming steadily smaller, deformations of the substrates that occur because of thermal action have a negative effect on the bonding result.

SUMMARY OF THE INVENTION

It is therefore the object of this invention to provide a method with which the bonding result is improved.

This object is achieved with the features of the independent claim(s). Advantageous further developments of the invention are indicated in the subclaims. Also, all combinations that are comprised of at least two of the features indicated in the specification, the claims and/or the figures fall within the scope of the invention. In the indicated ranges of values, values lying within the above-mentioned limits are also to be disclosed as boundary values and can be claimed in any combination.

The basic idea of this invention is to heat the substrates of the substrate stack that is aligned at the contact surfaces of the substrates, in particular, for the permanent bonding in the bonding system gently and uniformly from two surfaces to be heated (the sides facing away from the contact surfaces) of the substrate in order to minimize or to completely avoid in particular different deformations of the two substrates.

The invention describes in particular a modularized device as well as a process chain, which makes it possible to implement an alignment system for alignment and for temporary connection of two or more substrates to a substrate stack. In this case, the substrates that are aligned herein are transferred to a bonding system taking into consideration an especially sensitive path over a high-vacuum transfer section (i.e., without interruption of the vacuum). In the latter, the substrates are joined (bonded) durably and inseparably (i.e., permanently) without exposing the substrates to excessive or different expansions and deformations.

The alignment system is preferably designed in such a way that for attaching the substrate stack in the alignment unit before the transfer into a bonding unit, connecting elements that do not contaminate the substrate stack and that temporarily hold the substrate stack together are provided. The connecting elements can be removed without residue after the bonding.

In one embodiment of the invention, the substrate stack is processed within a vacuum transfer section to improve the bonding result with one or more systems for reduction of surface gases and/or moisture.

In particular, the invention deals with a unit or device and a method with which the substrate stack is or can be symmetrically heated. The contact surfaces of the substrates of the substrate stack that are brought into contact are used in particular as planes of symmetry. In other words, the substrate stack is heated equithermally from both sides.

The invention accordingly deals in particular with a method and a device for heating and bonding a substrate stack. The heating is preferably done symmetrically, in particular by infrared radiation.

According to another aspect of this invention, the components according to the invention are integral parts of a unit, in particular a high-vacuum cluster, which is designed in particular in modularized form. In the high-vacuum cluster, a process chain can be implemented until a substrate stack is bonded. In the high-vacuum cluster, special attention is paid to the sensitive handling with the substrates that are to be bonded. The sensitive handling relates in particular to a uniform, in particular symmetrical, introduction of heat into the substrates to be treated by different heating zones, which preferably is achieved by an upper dynamically movable heating system and associated chucks, and a lower, in particular rigid or static, heating system.

An especially gentle bonding process is preferably made possible by bringing the upper heating system close against the lower heating system in a controlled manner.

The process steps according to the invention are preferably run while preserving/maintaining the vacuum produced in the alignment unit, in particular also during the transport by the vacuum transfer section with a vacuum transfer chamber, in particular a high-vacuum transfer chamber.

In a special embodiment of the device, in particular a high-vacuum bonding device, it is conceivable, in addition to a symmetrical introduction of heat, preferably by uniformly bringing the opposite heating surfaces of the heating systems close to the substrates to be processed, to control the substrates based on their type of material as well as their thickness and/or to control the introduction of heat with consideration of the expansion coefficient in order to avoid different deformations, in particular expansions and/or distortions, in particular also when using different types of materials. In particular, the symmetrical heating serves to ensure the uniform (i.e., homogeneous) through heating of both sides of the substrate stack.

Important process parameters are in particular the heating rate and/or the heat output. The heating rate defines to what degree the substrate is heated per unit of time. In particular, the heating rate is set at a value of between 1° C./minute and 1,000° C./minute. Lower heating rates would be possible, but they are no longer economical at the target temperatures since the heating process would take too much time. Heating rates that are higher than 1,000° C./minute would quickly heat the substrates in such a way that damage to the substrates and/or alignment errors between the substrates can occur. The heat output indicates the amount of heat per unit of time, which is required in order to heat an object to a preset temperature. The heat output is applied by heating elements arranged in particular in the bond chucks, which are predominantly operated electrically. Under the assumption of ideal conditions, and therefore no power losses at all and a 100% conversion of the introduced electrical energy into heat energy, a lower limit of the necessary (electrical) output can be calculated, which is at least necessary to bring a substrate with a specific diameter and a specific thickness to the desired temperature within a desired time. The heat output corresponds to the energy per time unit that is introduced into a substrate. The energy that is introduced corresponds in particular to the heat that is introduced. The heat that is necessary to heat a body from a starting temperature to an end temperature corresponds to the product from the temperature difference that is to be overcome, specific heating capacity and weight of the body. The weight of the body can be calculated at a given density and dimensions. Substrates are preferably round and very often single crystals. Therefore, they have geometries that are to be calculated and a homogeneous density. The calculation of the weight as a function of the geometric parameters, in particular the thickness and the diameter, can be done in an automated manner according to the invention. The thus determined amount of heat is then divided by the desired minimal time in which the corresponding temperature difference is to be overcome. This leads to the heat output. The electrical power is then correspondingly selected. Since the entire electrical power is not converted into heat output, the actual electrical power that is to be introduced is selected correspondingly higher in order to compensate for power losses.

The table shows the minimum electrical power that is necessary to heat a silicon substrate with a diameter of 200 mm and a thickness of 725 μm in the indicated times from 25° C. to 525° C. The actual electrical power is to be higher based on power losses. The electrical power of the heaters used is in particular higher than 100 W, preferably higher than 1,000 watts, still more preferably higher than 5,000 watts, most preferably higher than 10,000 watts, and all the more preferably higher than 20,000 watts.

According to the invention, the pressurization of the first substrate is carried out in particular by a first pressure surface of a first pressure plate, which preferably is the first heating surface at the same time. The pressurization of the second substrate is carried out in particular by a second pressure surface of a second pressure plate, which preferably is the second heating surface at the same time.

According to the invention, in this respect, in particular formulas or process sequences that are to be determined and secured in advance are used, which preferably take into consideration material-specific properties and/or the specific conditions, in particular the material strength, of the substrates that are to be bonded. In addition to a possible, fully automatic processing of the formulas, a semi-automatic use of the system as well as, moreover, a manual use of the system in question is also conceivable.

If the substrates to be bonded are comprised of materials that very strongly reflect the thermal radiation and thus considerably slow down or impede a desired introduction of heat, the formulas are matched accordingly. Conversely, however, an increased absorption of the thermal radiation by correspondingly highly-absorbent materials and/or surface conditions would also be conceivable, whereby the formulas, in particular heating times, would be correspondingly shortened.

The system according to the invention is in particular able to detect factors that influence the heating, in particular by sensors, and to take these factors into consideration in the process sequence and/or to adjust these factors in the case of subsequent steps or subsequent substrate stacks.

In addition, the system according to the invention makes it possible in a preferred way to treat the substrates by convection and/or various heating zones advantageously so that a uniform introduction of heat is achieved. The heating of the substrates is preferably done via convection of a gas that is introduced into the bonding system, in particular into the bond chuck, still more preferably a studded chuck (disclosed in particular as an independent aspect of the invention). While the gas provides for the transfer of heat by convection, the bonding system is preferably continuously evacuated, so that in the bonding chamber, a pressure of less than $10^{-2}$ mbar, still more preferably less than $10^{-3}$ mbar, is set. The introduction of the gas is done in particular before and/or during an evacuation of the bonding system. The gas can be directed from outside, preferably by a line of the bond chuck and/or a pressure plate with respect to the substrate stack and/or bond chuck or pressure plate. In the case of a

| Material Parameters | | | | | | | Process Parameters | | | |
|---|---|---|---|---|---|---|---|---|---|---|
| $C_5$ J kg$^{-1}$ K$^{-1}$ | Density g cm$^{-3}$ | Density kg m$^{-3}$ | t m | d m | V m$^3$ | Mass kg | ΔT K | Q J | t Minutes | L Watts |
| 710 | 2.336 | 2336.000 | 0.000725 | 0.200 | 2.27765E−05 | 0.053 | 475.000 | 17943.72795 | 1 | 299.062 |
| 710 | 2.336 | 2336.000 | 0.000725 | 0.200 | 2.27765E−05 | 0.053 | 475.000 | 17943.72795 | 5 | 59.812 |
| 710 | 2.336 | 2336.000 | 0.000725 | 0.200 | 2.27765E−05 | 0.053 | 475.000 | 17943.72795 | 10 | 29.906 |
| 710 | 2.336 | 2336.000 | 0.000725 | 0.200 | 2.27765E−05 | 0.053 | 475.000 | 17943.72795 | 15 | 19.937 |
| 710 | 2.336 | 2336.000 | 0.000725 | 0.200 | 2.27765E−05 | 0.053 | 475.000 | 17943.72795 | 20 | 14.953 |
| 710 | 2.336 | 2336.000 | 0.000725 | 0.200 | 2.27765E−05 | 0.053 | 475.000 | 17943.72795 | 25 | 11.962 |
| 710 | 2.336 | 2336.000 | 0.000725 | 0.200 | 2.27765E−05 | 0.053 | 475.000 | 17943.72795 | 30 | 9.969 |
| 710 | 2.336 | 2336.000 | 0.000725 | 0.200 | 2.27765E−05 | 0.053 | 475.000 | 17943.72795 | 35 | 8.545 |
| 710 | 2.336 | 2336.000 | 0.000725 | 0.200 | 2.27765E−05 | 0.053 | 475.000 | 17943.72795 | 40 | 7.477 |
| 710 | 2.336 | 2336.000 | 0.000725 | 0.200 | 2.27765E−05 | 0.053 | 475.000 | 17943.72795 | 45 | 6.646 |
| 710 | 2.336 | 2336.000 | 0.000725 | 0.200 | 2.27765E−05 | 0.053 | 475.000 | 17943.72795 | 50 | 5.981 |
| 710 | 2.336 | 2336.000 | 0.000725 | 0.200 | 2.27765E−05 | 0.053 | 475.000 | 17943.72795 | 55 | 5.437 |
| 710 | 2.336 | 2336.000 | 0.000725 | 0.200 | 2.27765E−05 | 0.053 | 475.000 | 17943.72795 | 60 | 4.984 | use according to the invention of a bond chuck with a studded contact surface, in particular heating surface of the heating system, the gas is optimally distributed between the substrate holder and/or the pressure plate and the substrate stack based on the defined topography.

While the substrate stacks that are aligned with one another lie in the bonder (in particular on a studded chuck) and the surrounding area around the substrates is evacuated, a gas that ensures the conduction of heat between the (studded) bond chuck and the substrate stack flows (in particular from the studded chuck). Evacuation is done around the outside, and flushing is done between the substrate stack and the (studded) bond chuck. By flushing, the pressure applied by the vacuum system is correspondingly reduced in the bonding chamber.

One of the most important aspects according to the invention is preventing a shifting of the substrates toward one another from being carried out by the heating of substrates, by which the alignment of the substrates with one another is lost again. Viewed in physical terms, the invention ensures that the thermal expansions of the two substrates that occur in the case of a temperature change are always the same. If both substrates are comprised of the same material, the two substrates thus are preferably equally tempered.

In further development of the invention, the heating systems are therefore controlled during heating and converging in such a way that at least during the vast majority of the converging period, the difference between the mean temperature of the first substrate and that of the second substrate is smaller than 5° C., in particular smaller than 1° C., preferably smaller than 0.5° C., and still more preferably smaller than 0.1° C. Should the two substrates that are aligned with one another be comprised specifically of the same material but have different thicknesses, it can happen that the temperature change in one of the two substrates, in particular in the substrate with the larger thickness, runs slower than in the other substrate, in particular the one with the smaller thickness. In such a situation, a shifting of the two substrates can therefore occur during the heating process despite identical material characteristics, but different geometry characteristics. In the ideal case, however, the alignment produced in advance by an alignment unit would be correctly adjusted again after the total heating of the substrates. Should the materials and thus the material characteristics of the two substrates, in particular the thermal expansion coefficient or the thermal expansion tensor and/or the heat conductivity and/or the heat capacity be different, the result is an undesirable shifting of the substrates toward one another. This can be compensated by methods according to the invention. In this case, the heating systems are controlled during heating and converging in such a way that at least during the vast majority of the converging period, the difference between the mean temperature of the first substrate and that of the second substrate is greater than 0.1° C., in particular greater than 0.5° C., preferably greater than 1° C., and still more preferably greater than 5° C. to compensate for the difference between the thermal expansions of the two substrates, so that the alignment is maintained as well as possible.

As an alternative or in addition, it may be advantageous to control the heating systems during heating and approaching in such a way that the radiation energy of the first heating surface that strikes the first surface during approaching is the same as the radiation energy of the second heating surface that strikes the second surface.

According to another advantageous embodiment of the invention, an improvement of the bonding result is achieved by a heating of the substrates upstream from the bonding and thus accompanying a gas emission, in particular within the vacuum transfer section and even before reaching the actual bonding system.

After reaching the bonding system and even before the actual bonding process, a uniform or homogeneous (symmetrical or asymmetrical) heating of the substrates, adapted to the individual requirements, is preferably performed. In this respect, (thermal) stresses owing to uneven expansions within the substrates are avoided to a large extent, which has a positive effect on the desired bonding result. The thermal expansion coefficient of silicon is, for example, in the range of $2.6 \cdot 10^{-6} \text{ K}^{-1}$. If both substrates are manufactured from the material silicon, the two also have the same (averaged) thermal expansion coefficients (under the assumption that both substrates have the same crystal orientation, whereof in most cases, it can be assumed as most silicon wafers have a crystallographic (100) orientation, and under the assumption that the thermal expansion in the substrate plane is isotropic). Accordingly, substrates that are equally loaded thermally will also experience the same thermal expansions. Should the materials be different, their thermal expansion coefficients are in general different. These different thermal expansions can be compensated according to the invention.

According to another, preferred aspect of this invention, a receiving system for receiving the substrate stack at least during the bonding is provided. The receiving system is suitable in particular for receiving the substrate stack, in particular on the periphery or in a peripheral area. More preferably, the receiving system is suitable to hold together the substrates on the contact surfaces and to hold them in the aligned position until the substrates are bonded. The receiving system, in particular the studded bond chuck, preferably presses or brings into contact only a small section of the surfaces of the substrates facing away from the contact surfaces; the receiving system preferably covers the surface of the substrates, to be loaded with radiation heat, barely or not at all. In other words, the majority, in particular at least ¾, preferably at least 90%, of the substrate surfaces exposes the heating surfaces of the heating systems arranged at some distance away.

Due to a reduction of the surface of the substrates, which is brought into contact by the receiving system, an undesirable contamination of the substrates is reduced. In addition, with the described procedure, the throughput is increased, since the complete heating-up and cooling-down of the receiving system predominantly covering at least one surface that was previously time-intensive and necessary after each bonding process can be eliminated.

Another aspect of the embodiment according to the invention is that a heating of the substrate stack is done on both sides at least during the heating up to the bonding temperature at least predominantly by heat radiation and/or heat convection, in particular by natural heat convection. This is produced in particular by spacing the substrate surfaces from the heating surfaces.

By the distance during the heating being reduced, the heat output introduced by heat radiation increases relative to the heat output introduced by heat convection. As soon as the heating surfaces, preferably simultaneously, bring into contact the respective surface of the substrates, the heat output is transferred at least partially, preferably predominantly, by heat conduction between the surfaces and the heating surfaces. Preferably, at least up to ¾ of the bonding temperature is reached before heat conduction and/or pressurization is/are carried out.

A possible heat convection from above and below has the advantage that existing irregularities that impede a uniform and advantageous heating of the substrates can be greatly reduced or completely precluded during the bonding process.

In a special, in particular separate according to the invention, implementation of the bond chuck and/or the heating surfaces, they comprise studs to ensure the lowest possible contamination of the substrate surfaces. This also makes it possible in addition to supply the gas necessary for convection during pressurization.

The contact surfaces of the studs can be designed in particular in a bomb-shaped manner in order to further reduce the contact surfaces of the heating surfaces with the substrate surfaces.

The studded surface is further developed in a preferred embodiment by the entire radial peripheral area of the heating surface or pressurization surface being bounded by an arm. In this connection, an escape of the gas directed into the studded pressure plate is prevented or reduced. The peripheral areas of the upper and lower studded pressure plates in particular seal off in a positive manner with the substrate to be processed and thus prevent the gas from escaping.

According to the invention, it is conceivable to provide a passage that advantageously extends between the arm that bounds the entire radial side area and the substrate that is to be processed and over which it is possible to discharge excess gas from the studded surface, in particular in a controlled manner, preferably in the form of a valve.

Process-accelerating measures, such as the contamination-reducing automated transfer of the substrates aligned in the alignment unit by a process robot located within a vacuum transfer section with an especially distinct receiving system, in particular in the form of a support surface, which provides a contact of the substrate only on the radial periphery, are not yet known. This receiving system can, moreover, in addition be exposed to an electrostatic force in order to further increase the receiving forces of the process robot.

Also, the alignment of upstream and/or downstream processes such as the tempering of the substrates can be viewed as an advantageous embodiment of the invention in order to remove surface gases and/or moisture before introduction into the vacuum bonding system and thus to improve the bonding result.

As another, in particular separate, invention, a continuous treatment from the alignment up to bonding in a vacuum, in particular a high vacuum, that continues through all, in particular modularized, components, is disclosed, in which both foreign atoms and reactions of substrate material, in particular oxidation, are ruled out to a very large extent.

Another advantage of the embodiments according to the invention is the increase in precision of a fabricated bond. Below, it is understood that the positioning accuracy of several structures of the substrates with respect to one another, achieved by the alignment unit, is not lost by the heat treatment in the bonder. In the state of the art, deformations occur in particular in that inhomogeneously heated substrate stacks, for example based on substrates that are comprised of different materials and thus different thermal expansion coefficients, shift or are deformed before the bonding process is concluded, i.e., the process of the pressurization begins or takes place. The invention allows, however, the preservation of the adjustment accuracy of the alignment system between several structures up to and beyond the actual bonding process. The achieved and retained alignment accuracy, i.e., the maximum shifting between the structures at the opposite substrates of the aligned substrate stack until the completion of the bonding, is, according to the invention, in particular less than 10 µm, preferably less than 1 µm, more preferably less than 100 nm, and most preferably less than 10 nm.

In isothermal operation, the embodiment according to the invention allows an increase in the throughput since the heaters and thus the bond chucks as well as the pressure plates preferably are not constantly heated and cooled, but rather can produce, in particular at least predominantly, preferably exclusively, by a change in positioning, a temperature change on the substrate stack. Components of the bonder, in particular at least one of the pressure plates, can be moved almost at full bonding temperature into a stand-by position and can wait there for the next substrate stack, without having to be cooled.

The contamination of the substrates of the substrate stack is lower, since the substrate stack does not lie predominantly on the surfaces to be heated until there is pressurization but rather is held in abeyance and thus has virtually no contact with contamination material. In the case of contact for pressurization, according to the invention, a studded bond chuck is preferably used in particular also as a pressure plate and/or heating surface, which minimizes the effective contact surface to the substrates even in the case of the pressurization. The contact surface of the studded bond chuck according to the invention is in particular smaller than 90%, preferably smaller than 50%, more preferably smaller than 25%, most preferably smaller than 5%, and with utmost preference smaller than 1%, of the substrate surface.

The device according to the invention is comprised in particular of a modular designed system/unit, which in a first embodiment comprises at least three modules to be controlled independently of one another, namely an alignment unit (i.e., aligner), a vacuum transfer section with an integrated handling system, in particular the process robot for handling substrates, as well as a bonding unit. For processing reasons, supplementing with additional modules is possible. In particular, many modules can be provided in multiple ways for acceleration and parallel processing.

The charging of the alignment unit with the at least two substrates to be aligned is carried out manually, but can preferably be done semi-automatically or even more preferably in a fully-automated manner.

The substrates are preferably wafers. The wafers are standardized semiconductor substrates with well-defined, standardized diameters. The substrates can have any shape. In particular, the substrates can be rectangular or round. Should the substrates be round, the diameters of the substrates can also be of any size but in most cases are standardized diameters of 1, 2, 3, or 4 inches as well as 125, 150, 200, 300 or 450 mm.

Hereinafter, in the patent specification, substrates are referred to in general. In particular, the embodiments according to the invention relate primarily to wafers, however.

The substrates are aligned with one another and form a substrate stack. The substrate stack is comprised of at least two substrates. However, more than two, preferably more than five, more preferably more than ten, and most preferably more than 15 substrates can also be aligned with one another and can be connected temporarily to a substrate stack. The substrates can be comprised of any material. Preferably, materials that are used in the semiconductor industry are involved. They preferably include semiconductors such as silicon, germanium, glasses, such as, for example, quartz, semiconductor heterostructures such as GaAs or ceramics. Also, even the use of polymer substrates or metal substrates would be conceivable. The thicknesses of substrates vary between 10,000 μm and 50 μm, whereby substrates with correspondingly small thicknesses are produced in the respective thickness by grinding and polishing processes. Carrier substrates that are used only for supporting other substrates, the so-called product substrates, have large thicknesses, while product substrates are always more greatly thinned in order to achieve a correspondingly high packing density of functional units in the product substrates by stacking. The thickness of a carrier substrate is larger than 200 μm, preferably larger than 500 μm, most preferably larger than 700 μm, and with utmost preference larger than 1,000 μm. The thickness of a product substrate is smaller than 1,000 μm, preferably smaller than 500 μm, more preferably smaller than 100 μm, and with utmost preference smaller than 50 μm.

In addition, the alignment unit is equipped with a device for receiving and attaching substrates, which allows it to attach substrates to one another after the alignment.

In particular, the alignment unit comprises a device that makes it possible to align substrates with respect to one another and thus to attach them temporarily with an attaching means so that a transport is possible from the alignment unit over a vacuum transfer section to another module, in particular a bonding system, without this transport having a negative effect on the aligned substrates. Especially preferably, the attaching unit is a device for magnetic attachment of the substrate stack, as described in the publication PCT/EP 2013/056620, to which reference is made in this respect. Alternatively, clamping can be done by mechanical clamps, which clasp the sides of the substrates in a small peripheral section and no longer have to be attached to a bond chuck. The attaching of the substrates below one another by an electrostatic attractive force between the substrate surfaces would also be conceivable. Tacking (sewing) represents another conceivable way of attaching the substrates to one another. This involves a local bonding or adhesion of the two substrates by the application of a concentrated point force, in particular a concentrated electric current or a greatly limited impact of very high heat, preferably by a laser. This locally-limited stressing between the surfaces of the two substrates provides at least for a local attachment, which is sufficient to be able to transport the two substrates without causing a shifting of the two substrates toward one another.

According to the invention, the individual modules are equipped in particular with connecting locks that are located in the respective passages to the individual modules and with which it is possible to provide defined atmospheres that have a positive influence on the subsequent process.

According to the invention, a lock is an area, in particular a space, which is connected by two floodgates from two additional areas, in particular spaces, separated from one another but connected to the locks. The access from and/or by the locks in and/or from one of the two spaces is provided by floodgates. The floodgates can be triggered in particular individually. The floodgates are designed in particular as valves or gate valves. Hereinafter, no explicit distinction is made between floodgates and/or locks. In this respect, it is meant that when using the word floodgate, in particular also an entire lock, therefore an area, in particular a space, with two floodgates can be meant.

In the individual modules, it is accordingly possible to produce different atmospheres based on the requirements of the respective process. In addition, it is possible to control processes in the vacuum transfer module that make possible an acceleration of the entire bonding process. In this connection, a heating done upstream from the bonding that makes it possible to preheat substrates that are to be bonded in order to deliver the latter, subsequently tempered, to the vacuum chamber module is conceivable. As a result, the time-intensive heating of the heating systems of the bonding system is significantly shortened, which has a direct effect on the throughput that is to be expected.

In addition, in particular an upstream heating for preconditioning of the substrates independently of one another is conceivable. Before the introduction into the alignment unit, the substrates can preferably be heated to >100° C. In this case, the free path length for molecules on the surface can be maximized. For example, the substrates can be heated at a great distance to a chamber wall (>1 cm, >5 cm, >10 cm). The large free path length that is produced in this case requires that foreign atoms and gases be transported away from the substrate surfaces. During transport of the individual substrates in the alignment unit, the temperatures preferably fall again to room temperature.

The alignment of the substrates is carried out in the alignment unit in particular under high-vacuum conditions, which preferably essentially correspond to the pressure conditions in the bonding system. After the substrates are aligned, an automated transport is carried out via a process robot from the alignment unit to a vacuum transfer module, in which preparatory measures for the bonding planned in the subsequent course of the process can be carried out.

After the transfer of the substrate stack from the vacuum transfer section module into the bonding module, the substrate stack is laid down by the robot on removable loading pins. A direct contact between the loading pins and the substrate stack is carried out only partially. According to the invention, at most thirty, preferably less than 20, more preferably less than 10, most preferably less than 5, and in most cases preferably exactly three loading pins, are used.

The substrate stack that is to be bonded thus floats between a dynamic first heating surface and pressure plate that can be brought up to the substrates and an in particular static, second heating surface. Both the first (in particular upper) and the second (in particular lower) heating system and pressure plate advantageously have approximately the same diameter as the substrates to be treated or are larger. The first heating surface and pressure plate can be brought back up both symmetrically and asymmetrically to the substrates. In the case of an asymmetrical heating of the substrate, the separation distance, even when dynamically bringing the first heating surface and pressure plate up to the substrates located in the substrate receiving means, is not equal to the separation distance between the second heating surface and pressure plate of the substrate receiving means that is located between the first and second heating surfaces or to the substrate surfaces that are to be heated.

The separation distance between the first and/or second heating surface(s) and the substrate stack during the loading process is in particular greater than 1 mm, preferably greater than 5 mm, more preferably greater than 10 mm, and most preferably greater than 30 mm.

The temperatures of the first and/or second heating surface(s) during the loading process are in particular higher than 25° C., preferably higher than 100° C., and more preferably higher than 300° C.

The heating rate of the substrate stack is to be controlled in particular by the separation distances A of the first heating surface and/or B of the second heating surface relative to the substrate stack or to the respective surfaces. Thus, it is in particular possible according to the invention to operate temperature programs and/or cycles without having to constantly cool or heat the heating systems and thus the bond chucks and/or the pressure plates. A similar procedure was already used in the patent specification PCT/EP2013/064151 in order to heat a liquid by the positioning of a heater without the heater having to be constantly heated or cooled. Owing to this embodiment according to the invention, it is possible to heat a heater to a specific temperature, in particular the bonding temperature, to establish its position, however, during the loading process far from the loading plane of the substrate stack so that the loaded substrate stack is initially heated to a very small extent (i.e., in particular during loading). Only by the approaching is a correspondingly controlled, in particular symmetrical, heating of the substrates, specified according to the boundary conditions, carried out. This process according to the invention functions in particular when the heating of the substrate stack is carried out at least predominantly, preferably exclusively, by heat radiation, not via heat convection. In particular, this process according to the invention has maximum effectiveness under vacuum.

In the case of a symmetrical heating of the substrates, the separation distance A during a dynamic bringing of the first heating surface and pressure plate up to the substrates is equal to the separation distance B of the second, in particular static, second heating surface. This is achieved in particular by both controlled and in particular continuous bringing-up of the first heating surface to the second heating surface, whereby at the same time, the receiving system receiving the substrate stack is brought close to the second heating surface. The first heating surface is preferably moved exactly twice as fast as the substrate stack to the second heating surface.

In an alternative embodiment, the receiving system remains stationary with the substrate stack, and the two heating surfaces are moved, in particular at the same speed and under the same symmetrically decreasing separation distances A and B, from above and below with respect to the substrate stack.

For both symmetrical and asymmetrical heating, formulas, determined in particular empirically in advance or by measurements, are stored in a control system and provide for an optimized heating of the substrates taking into consideration existing parameters. As parameters, primarily the type of material, thickness, heating temperature and bonding method are considered.

The asymmetrical approaching or positioning primarily has the object of making possible a different heat input into the substrates in order to be able to compensate for the thermal expansions of two substrates of different materials. In general, each material has a separate thermal expansion coefficient. In order to achieve an equal expansion of the two substrates, in this case the substrate with the higher thermal expansion coefficient is heated to a lower temperature than the substrate with the lower thermal expansion coefficient. This can be carried out according to the invention by different temperatures on the first heating surface and the second heating surface and/or by different separation distances A and B.

Another aspect according to the invention is that a gas input between the contact surfaces of the substrate stack is prevented after the first pressure plate and the second pressure plate are brought into contact or the bond chuck is brought into contact with the substrate stack, and then a gas is introduced into the bonding system. The latter is propagated between the rough surface of the substrate stack and the bond chuck or the pressure plates and thermally follows the surface unevenness.

Thermal closing is defined as the introduced gas serving as a heat transfer system in order to introduce the heat from the heaters via the bond chuck or the pressure plate as quickly as possible into the substrate stack. The gas pressure between the bond chuck and the substrate stack is in this case in particular >0.01 mbar, preferably >0.1 mbar, more preferably >1 mbar, and with utmost preference >3 mbar. This gas pressure is achieved in particular by small gas amounts (flow rates), preferably of >1 sccm, more preferably >5 sccm, and more preferably >20 sccm.

Owing to high pump output, in particular of several hundred liters per second, at the same time a high vacuum in the bonding chamber, in particular <0.001 mbar, preferably <0.0001 mbar, and more preferably <0.00001 mbar, can be maintained. In this case, a force acts in particular on the substrate stack, which prevents a lateral shifting. The applied bonding forces are preferably between 1 N and 200 kN, more preferably between 1 kN and 100 kN.

From this time, an ordinary bonding process that is already known in the state of the art is carried out. In this case, this can be a temporary bond or a permanent bond. Temporary bonds with temporary adhesives, permanent bonds such as eutectic bonds, anodic bonds, glass frit bonds, fusion bonds, metal (diffusion) bonds or bonds with permanent adhesives would be conceivable.

Although the embodiment according to the invention as well as the process according to the invention can be performed with almost all bond chucks, a studded bond chuck is preferred (independent aspect of the invention). A studded bond chuck is defined as a bond chuck whose surface is not even but rather has several small protrusions, the studs, which form a holding plane and carry the substrate stack thereon. These studs substantially reduce the contact surface with respect to the substrate stack and thus also reduce the probability of contaminating the substrate. The studded bond chuck is designed so that it withstands the applied bonding force.

The height of the studs is in particular smaller than 1 mm, preferably smaller than 0.1 mm, more preferably smaller than 0.01 mm, and most preferably smaller than 0.001 mm. Especially preferably, the pressure plate also has studs, so that the pressure plate is a studded pressure plate that has the same property according to the invention as the studded bond chuck.

In another special embodiment, at least one of the heating systems, preferably designed simultaneously as a bond chuck, has a heating surface that has several zones. These zones of the heating surface can preferably be actuated individually. The zones of the heater are preferably circular rings positioned concentrically to one another. Locally resolved temperature profiles can be produced by the targeted activation of the zones. The number of zones is greater than 1, preferably greater than 5, more preferably greater than 10, most preferably greater than 20, most preferably greater than 50, and with utmost preference greater than 100.

All described modules are those in which special atmospheres can be produced in a reproducible manner based on the material of the substrates and the requirements for the respective bonding method. In addition, the modules, independently of one another, are adjustable in particular in an infinitely variable manner. As an alternative, the individual modules can be operated even without a vacuum, i.e., at normal pressure. Also, atmospheric synchronization of two adjacent modules is possible to enable accelerated movement of substrates from one module into a module that is downstream within the process.

The pressure within the vacuum section and/or within the alignment system and/or within the bonding system is in particular less than 1 mbar, preferably less than $10^{-3}$ mbar, more preferably less than $10^{-5}$ mbar, most preferably less than $10^{-7}$ mbar, and with utmost preference less than $10^{-9}$ mbar.

Additional advantages, features and details of the invention follow from the subsequent description of preferred embodiments as well as based on the drawings.

BRIEF DESCRIPTION OF THE DRAWINGS

In the figures, the features that are the same or that have the same effect are identified with the same reference numbers.

DETAILED DESCRIPTION OF THE INVENTION

Figure 1A:
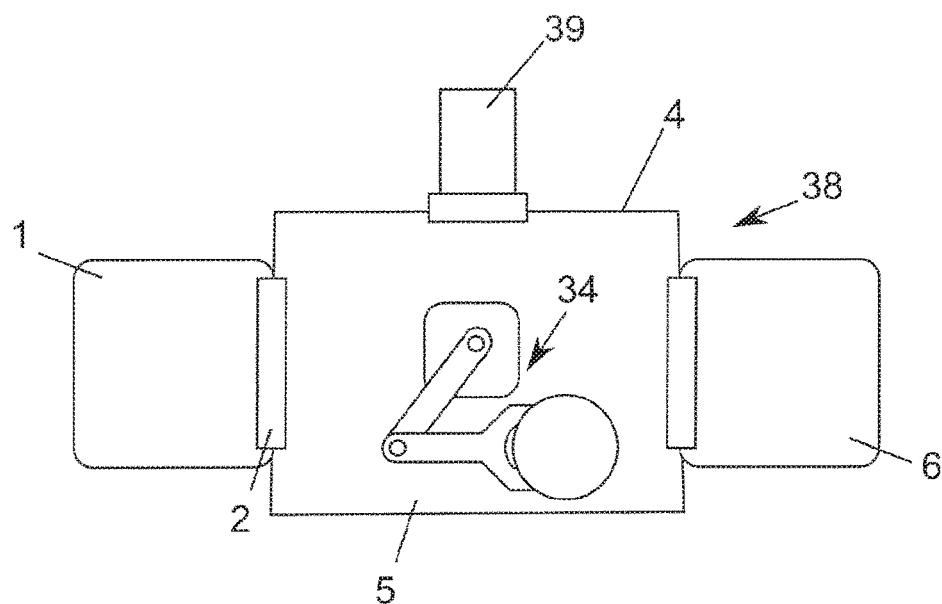
FIG. 1a a diagrammatic overview of a first embodiment of a vacuum cluster with specifically two attached modules, FIG. 1b a diagrammatic overview of a second embodiment of a vacuum cluster with seven attached modules, FIG. 2 a diagrammatic cross-section of an embodiment, according to the invention, of a bonding system before the loading of a substrate stack, FIG. 3 a diagrammatic cross-section of the embodiment according to FIG. 2 when placing the substrate stack on loading pins, FIG. 4 a diagrammatic cross-section of the embodiment according to FIG. 2 in the case of the removal of a robot arm from the substrate stack, FIG. 5 a diagrammatic cross-section of the embodiment according to FIG. 2 in the case of the removal of the robot arm from the module, FIG. 6 a diagrammatic cross-section of the embodiment according to FIG. 2 with symmetrical heating of the substrate with two heating systems, FIG. 7 a diagrammatic cross-section of the embodiment according to FIG. 2 in the case of the symmetrical approaching of the heating systems relative to the substrate stack, FIG. 8 a diagrammatic cross-section of the embodiment according to FIG. 2 in the case of the symmetrical approaching of the heating system relative to the substrate with contact of the first heating system with parts of the loading pins according to the invention, FIG. 9 a diagrammatic cross-section of the embodiment according to FIG. 2 when the substrate stack is brought into contact symmetrically, FIG. 10 a side view of a cross-section of the surrounding area of a studded bond chuck and a studded pressure plate, FIG. 11 a top view of a studded bond chuck according to the invention, and FIG. 12 a top view of a studded pressure plate according to the invention.

FIG. 1a shows a diagrammatic overview of a unit 38 that is designed in particular as a vacuum cluster, preferably as a high-vacuum cluster. The unit 38 is comprised of precisely two modules attached to a vacuum transfer chamber 4, a module with an alignment system 1 and a module with a bonding system 6 according to the invention. A robot 34 that is designed in particular as a process robot draws substrates 35, 36 (identical here) from a loading container 39 and transports the first substrate 35 and the second substrate 36, in particular at the same time, along a vacuum transfer section 5 into the alignment unit 1. The loading container 39 can also in particular be a lock or can act as such. The two substrates 35, 36 are aligned with one another and are attached, in particular temporarily, on a first contact surface 35k of the first substrate 35 and a second contact surface 36k of the second substrate 36 to form a substrate stack 14. As an alignment unit, for example, the units from the patent specifications PCT/EP 2013/075831 or PCT/EP 2013/062473 could be used. An optimal alignment is then provided when the structures that are to be aligned with one another, in particular also the alignment marks, optimally fit into one another according to the overlay model known in the industry. A corresponding description of such an overlay model is found in the patent specification PCT/EP 2013/061086.

Then, the robot 34 transports the attached and aligned substrate stack 14 in the bonding system 6, in particular by receiving the first substrate 35 on a first surface 35o or the second substrate 36 on a second surface 36o. The surfaces 35o, 36o are in each case facing away from the contact surfaces 35k, 36k.

Figure 1B:
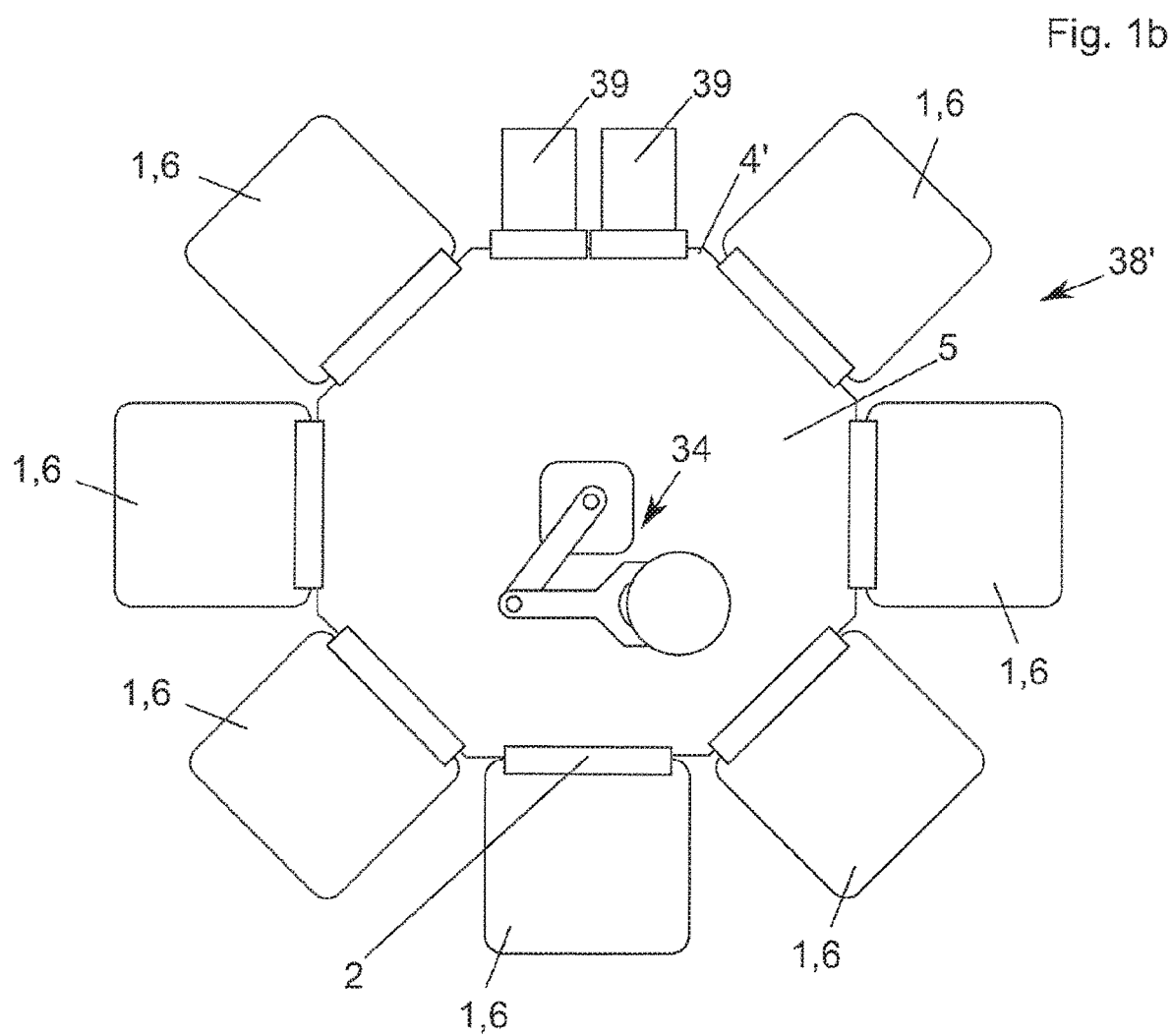

The unit 38' according to FIG. 1b shows a vacuum cluster that is comprised of several modules connected by a vacuum transfer chamber 4'. The modules may differ from one another in their functionality. In particular, modules for heating or cooling substrates or substrate stacks, purification modules, plasma modules, enameling modules with centrifugal enameling devices or spray-enameling devices, bonders 1 and debonders, coating modules, and alignment modules 6 are conceivable. The modules are preferably arranged in a circular or star-shaped manner around a vacuum transfer chamber 4'.

The vacuum transfer chamber 4' is connected via valves 2 to the various modules. The modules as well as the vacuum transfer chamber 4' can be evacuated independently of one another by the valves 2, but are always preferably located on the same vacuum level, preferably the high-vacuum level of the bonding system 6.

The bonding system 6 is depicted in FIGS. 2 to 9 in various processing states. The bonding system 6 is designed on a static supporting structure 23 in the form of a base plate and on columns attached to the base plate. The bonding chamber 10 is attached to the columns.

The bonding chamber 10 has a chamber opening 6o that can lock with the valve 2 for loading the bonding chamber 10.

The valve 2 is formed from a lock drive 24, in particular in the form of an actuator, supported on the base plate. The lock drive 24 serves to open and close a floodgate 27 that is driven by the lock drive 24, a floodgate that opens and closes the chamber opening 6o by a slot 6s. The valve 2 has seals 28 for sealing the bonding chamber 10 against the surrounding area in the closed state of the valve 2.

In addition, the bonding system 6 comprises a receiving system 18 for receiving the substrate stack 14. The receiving system 18 comprises a substrate base with a base plane E, on which the substrate stack 14 is laid down with the second surface 36o, so that the second surface 36o lies in the base plane E.

The substrate base is formed by at least two loading pins 21, in the embodiment shown four loading pins 21, running through the bonding chamber 10. The bonding chamber 10 is sealed by seals 20 surrounding the loading pins 21 relative to the surrounding area of the bonding chamber 10. The seals 20 simultaneously serve for sliding, translatory guiding of the loading pins 21.

The latter are attached on an in particular common adjustment plate 21p on the ends of the loading pins 21 opposite the substrate base. The loading pins 21 are preferably coupled to one another mechanically by the adjustment plate 21p and are moved in a translatory manner crosswise to the base plane E by an adjustment drive 22 that acts in particular centrically on the adjustment plate 21p, an adjustment drive 22 preferably in the form of a single loading pin actuator, or as an alternative by means of several loading pin actuators.

Within the loading pins 21, a second heating system 26 is arranged for heating the second surface 36o and an in particular full-surface, attached second pressure plate 25 on the second heating system 26. The second pressure plate 25 has a second heating surface 19, which can be arranged below the base plane E, parallel to the latter. The heating system 26 and the pressure plate 25 are connected securely to the bonding chamber 10 and are static, i.e., cannot move relative to the base plane E.

Opposite to the second heating surface 19, a first heating surface 15 can be arranged parallel to the base plane E and above the latter. The first heating surface 15 is arranged on a first pressure plate 29, which in turn is attached to a first heating system 30, in particular on the full surface.

The heating system 30 can be adjusted by drive means crosswise to the base plane. The heating system 30 is attached to an adjustment rod that runs through the bonding chamber 10. The adjustment rod is moved on the end opposite to the heating system 30 from a positional actuator 8 to control the position, in particular a separation distance A from the first heating surface 15 to the first surface 35o of the first heating surface 15. For pressurization, in particular after bringing the first surface 35o into contact with the first heating surface 15 and bringing the second surface 36o into contact with the second heating surface 19, a force actuator 9, which can apply the higher compressive force that is necessary for bonding, is used. The bonding chamber 10 is sealed by the seals 31, sealing the drive means, relative to the surrounding area.

The drive means are suspended on a supporting structure 7, comprising of a cover plate and columns supporting the cover plate.

The process according to the invention is described below based on FIGS. 2 to 9.

Figure 2:
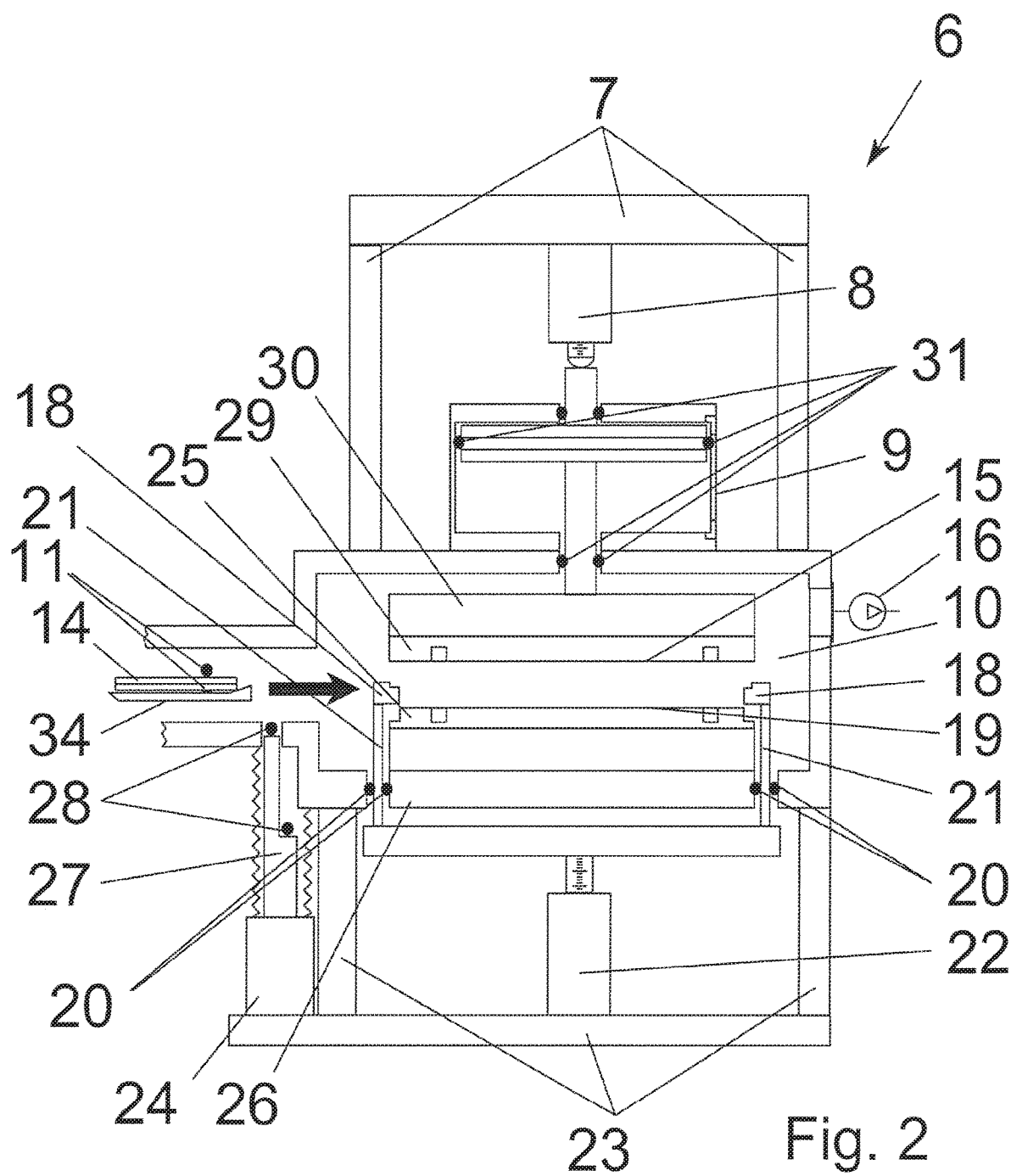

In a first step according to the invention in accordance with FIG. 2, the robot 34 is moved, in particular transferred, with the substrate stack 14 into a bonding chamber 10 of the bonding system 6. In the first step, the receiving system 18 according to the invention is located on a starting level for receiving the substrate stack 14. In the starting level, the substrate stack 14 relative to the contact surfaces 35k, 36k is preferably positioned symmetrically to the first heating surface 15 and to the second heating surface 29. This symmetrical starting position is primarily important when the second pressure plate 25 and/or the first pressure plate 29 were preheated by the corresponding heating systems 26, 30 thereof.

Figure 3:
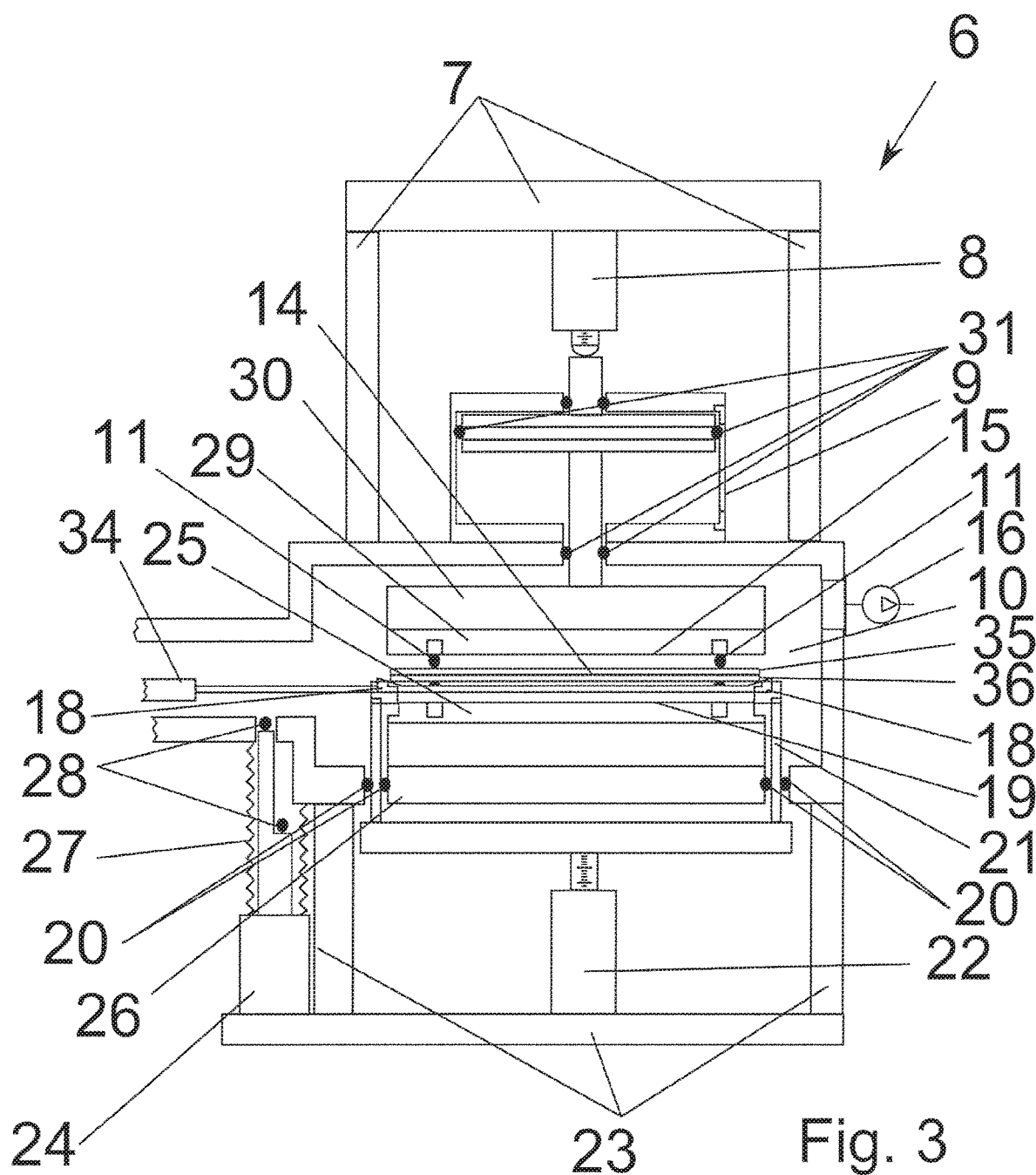

In a second step according to the invention in accordance with FIG. 3, the positioning of the substrate stack 14 is done in such a position that the attachments 11 for attaching the substrate stack, in particular magnetic clamps 11, with the heating surfaces 15, 19 subsequently being brought together, can be received precisely in recesses of the pressure plates 25, 29 provided for this purpose.

In addition, attention must be paid that the substrate stack 14 is loaded and positioned as centrically as possible to the loading pins 21 in order to prevent sliding or slipping.

Figure 4:
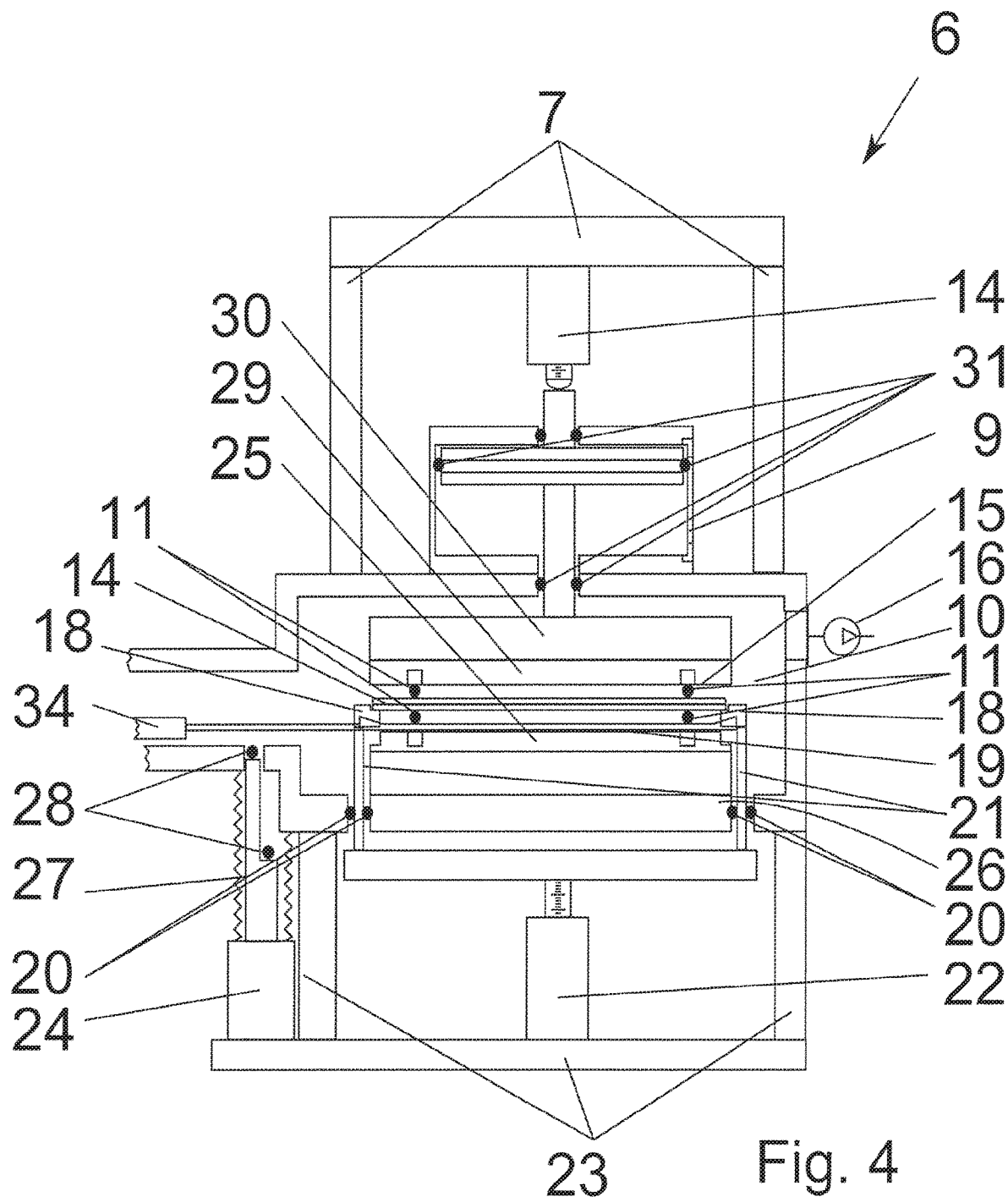

In a third step according to the invention in accordance with FIG. 4, the robot 34 is removed from the substrate stack 14 so that the substrate stack 14 rests on the loading pins 21. The second top side 36o now lies in the base plane E.

Figure 5:
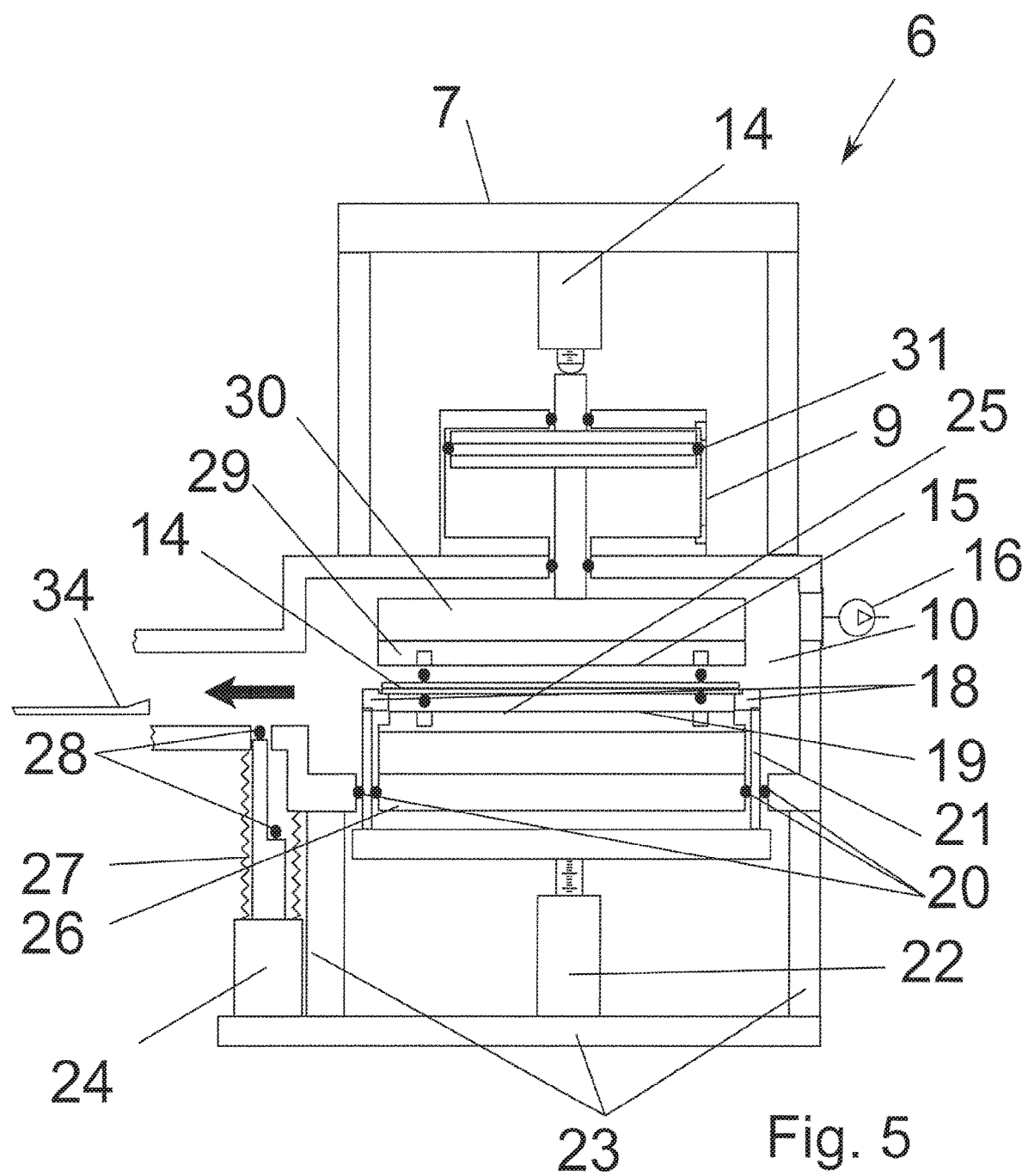

In a fourth step according to the invention in accordance with FIG. 5, the removal of the robot 34 from the bonding chamber 10 as well as the closing of the lock 27 are carried out. After the closing, the interior of the bonding system 6 can be evacuated via a pump 16 with a still higher vacuum should the vacuum prevailing in the adjoining vacuum transfer chamber 4 be set too low for the bonding process.

Figure 6:
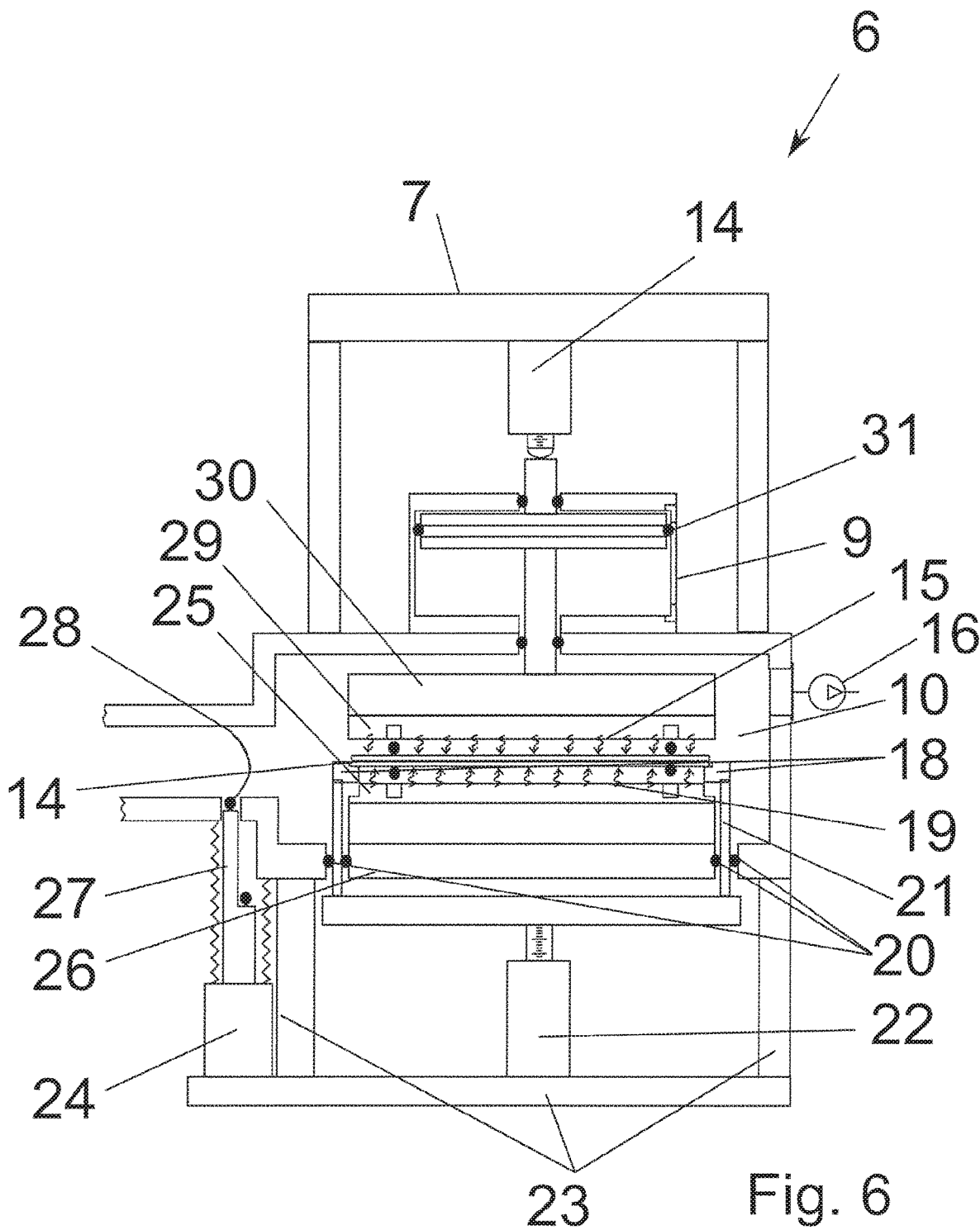

In a fifth step according to the invention in accordance with FIG. 6, the symmetrical heating of the two surfaces 35o, 36o of the substrate stack 14 facing away from one another is now carried out. It would also be conceivable, of course, that the two heaters 26 and 30 were already set and were kept at bonding temperature before the insertion of the substrate stack 14, which reduces the heating time of the pressure plates 29, 30 and the heating systems 26, 30 virtually to zero.

The heating is done by heat output produced by the heating systems 26, 30 and released over the heating surfaces 15, 19 as radiation heat 17.

The idea according to the invention is shown in particular in this process step. By the symmetrical positioning of the substrate stack 14, the temperature fields above and below the substrate stack 14 can be set in a fully equivalent manner, provided that the two heating systems 26, 30 are controlled with the same output and the same parameters and the pressure plates 25, 29 have the same or at least very similar properties and geometries/dimensions.

The substrate stack 14 is in particular not limited over the entire surface by a frictional force in its radial thermal expansion, but rather rests only peripherally on the loading pins 21. As a result, it can expand almost free-floating symmetrically, without stresses or bulges being caused.

A further significant advantage is that the contact of the two substrates 35, 36 of the substrate stack 14 with two heating surfaces 15, 19 is avoided at least during the heating process.

Figure 7:
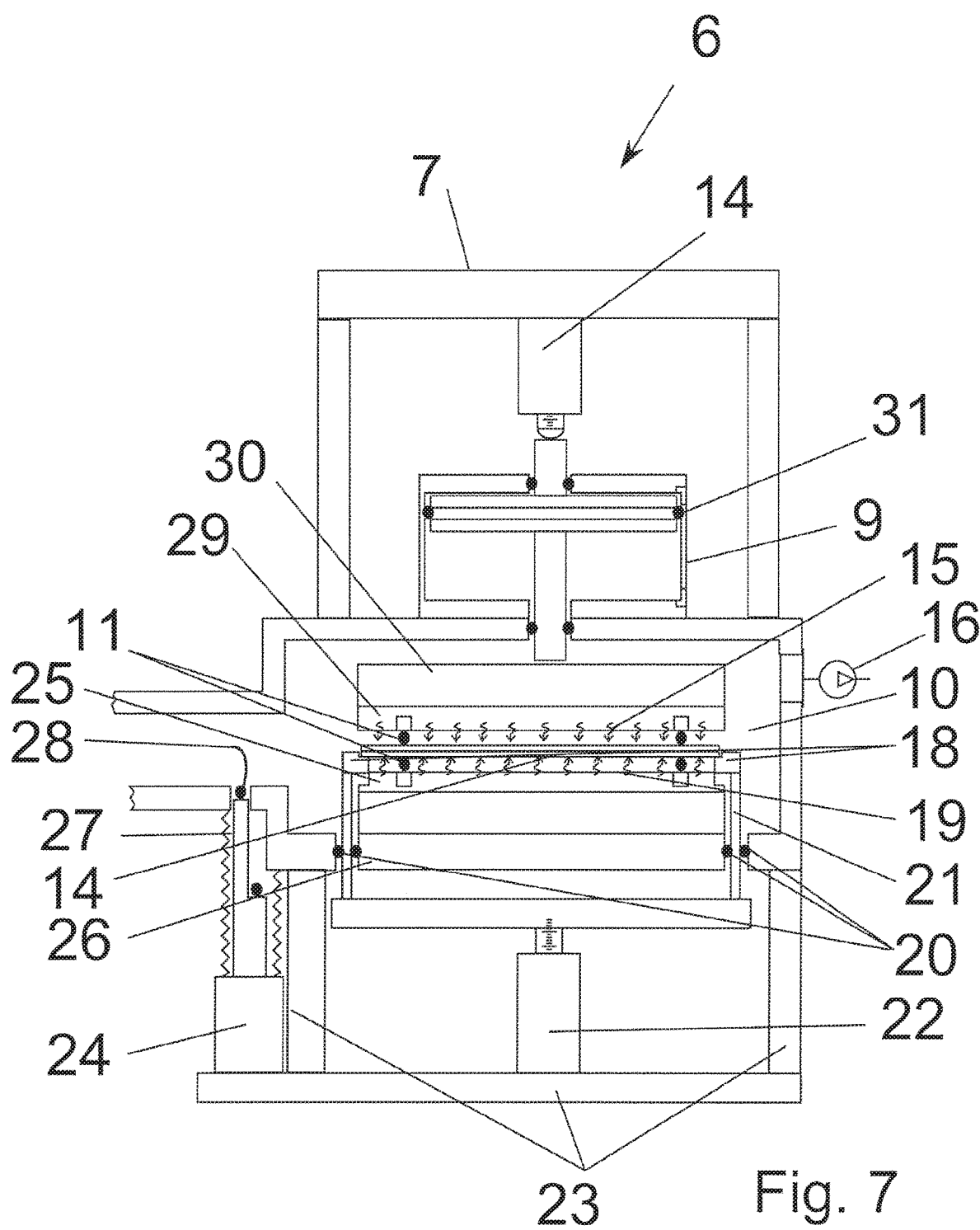

In a sixth step according to the invention in accordance with FIG. 7, the symmetrical approaching of the substrate stack 14 onto the second heating surface 19 and the first heating surface 15 is carried out. The second pressure plate 25 (in particular bond chuck) is in this case static and does not move. Rather, the loading pins 21 are moved by means of the loading pin actuators 22 onto the first heating surface 15. At the same time, the first heating surface 15 is moved to the second heating surface 19 or the substrate stack 14.

In order to keep the separation distance A between the substrate stack 14 and the first heating surface 15 equal to the separation distance B between the substrate stack 14 and the second heating surface 19, the first heating surface is moved at twice the speed of the loading pins 21. Another speed profile would also be conceivable, however, in order to produce a specific separation function and thus temperature function on the substrate stack and thus an at least partially asymmetrical approaching.

According to the invention, a reversal in which the first heating surface 15 is statically designed and the loading pins 21 as well as the second heating surface 19 move in the direction of the first heating surface 15 would also be conceivable.

In a special embodiment, an in particular identically quick, reverse movement of the two heating surfaces 15, 19 in the case of static loading pins 21 would also be conceivable.

Figure 8:
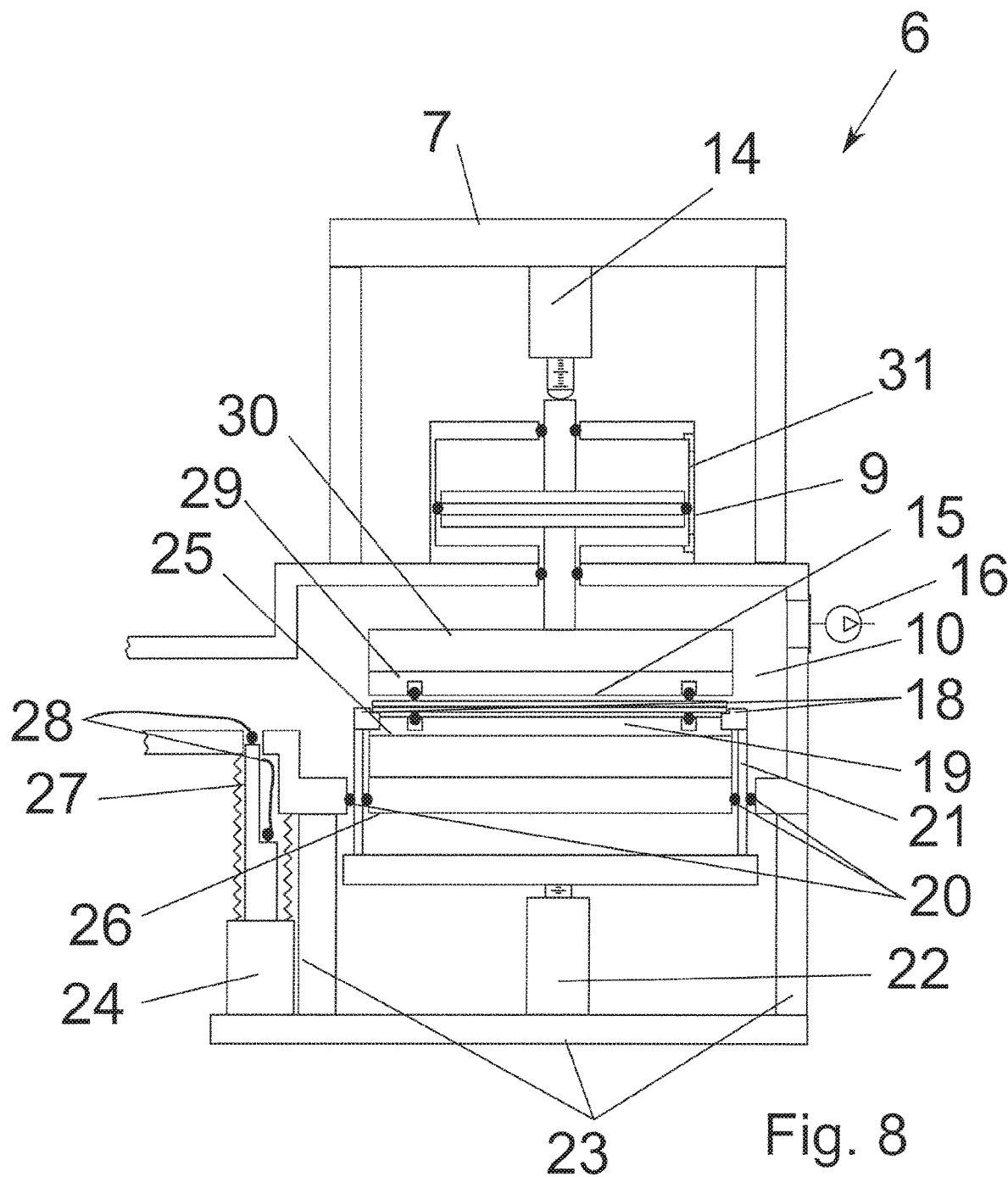
Figure 9:
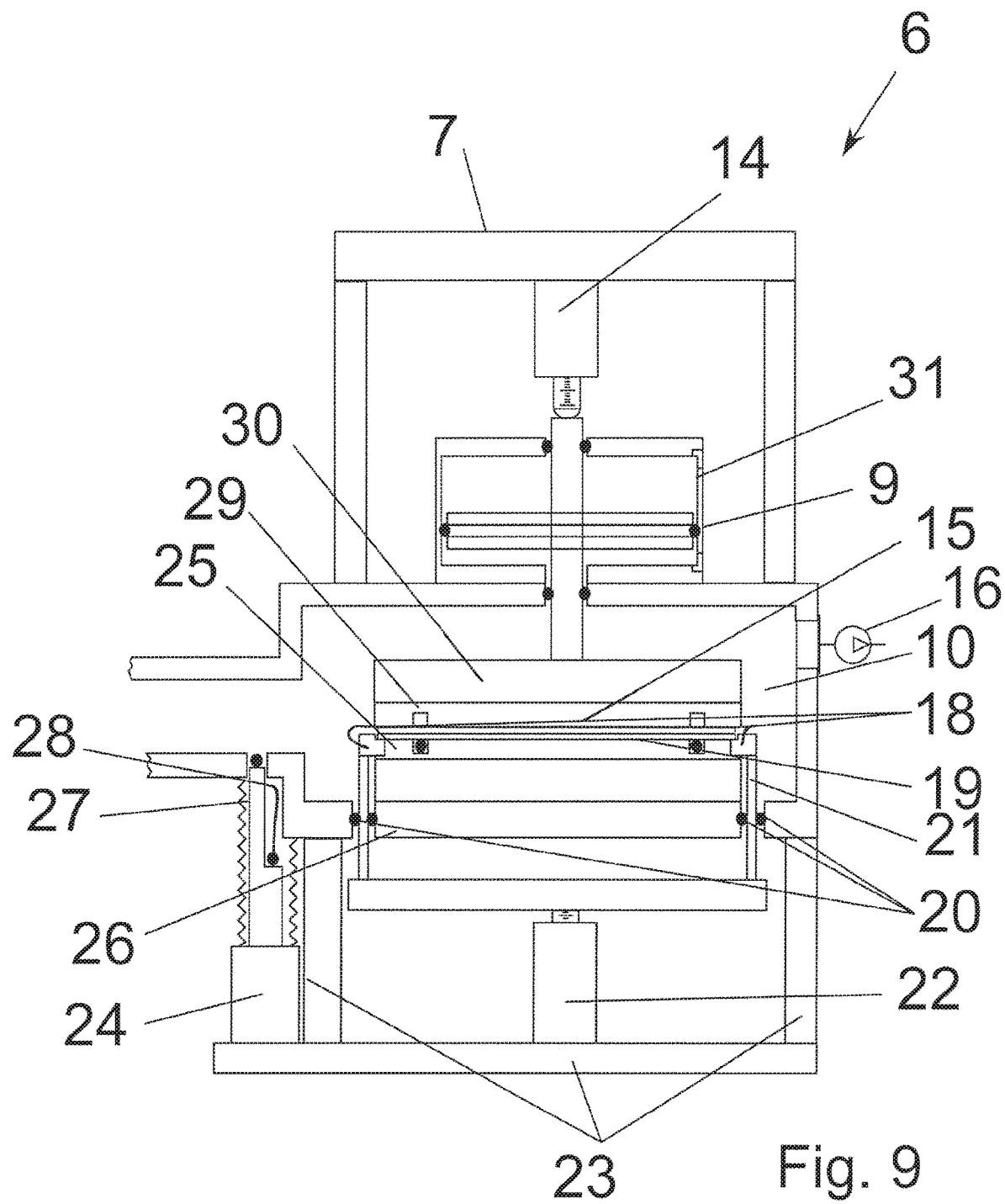

In a seventh step according to the invention in accordance with FIG. 8, finally the heating surfaces 15, 19 are brought into contact with the substrate stack 14. The force that is applied in this connection by the positional actuator 8 is sufficient to press both substrates 35 and 36 on one another so strongly that the thus produced frictional force no longer allows a mutual shifting along the base plane E (frictional connection).

The bonding system 6 can now be flushed with gas.

Preferably, the gas is introduced by lines within the second pressure plate 25 and/or first pressure plate 29 and is distributed when using a first pressure plate 29 and/or second pressure plate 30 with studs 37 or an additional studded pressure plate 42, 42', each applied on the pressure plates, between the studs 37 in the flow channels 32.

Gas that is fed between the studs 37 can be held up by an arm 40 that is located on the studs 37 on the sides of the pressure plate 25, 29 and that extends over the entire radial side area. The arm seals in particular in a positive manner with the substrate 35, 36 to be processed on its peripheral side.

In addition, it is conceivable to provide the arm 40 with a passage 41 that makes possible a controlled leakage of the excess gas from the studded surface. The passage 41 is advantageously smaller than 10 μm in diameter, preferably smaller than 7 μm, and more preferably smaller than 5 μm.

If no studs 37 or studded pressure plates 42, 42' are used, the gas is distributed by the existing surface roughness of the heating surfaces 15, 19, which replaces the studs 37.

Figure 11:
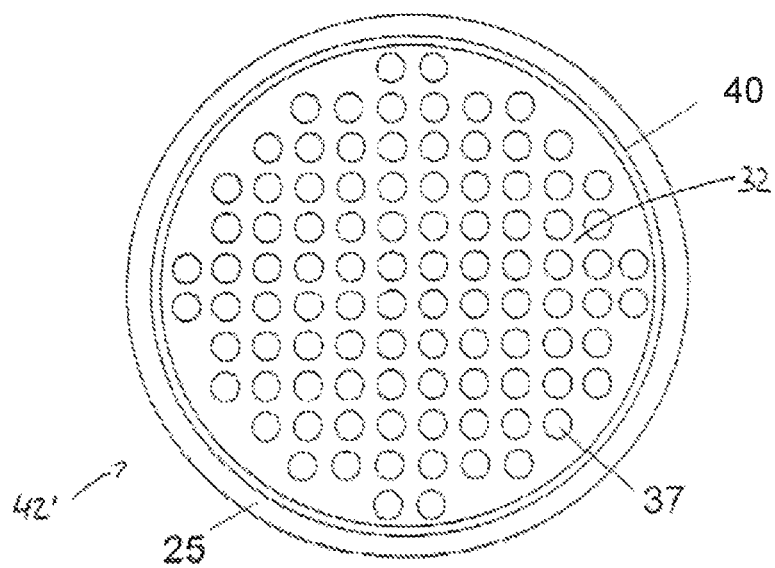
Figure 12:
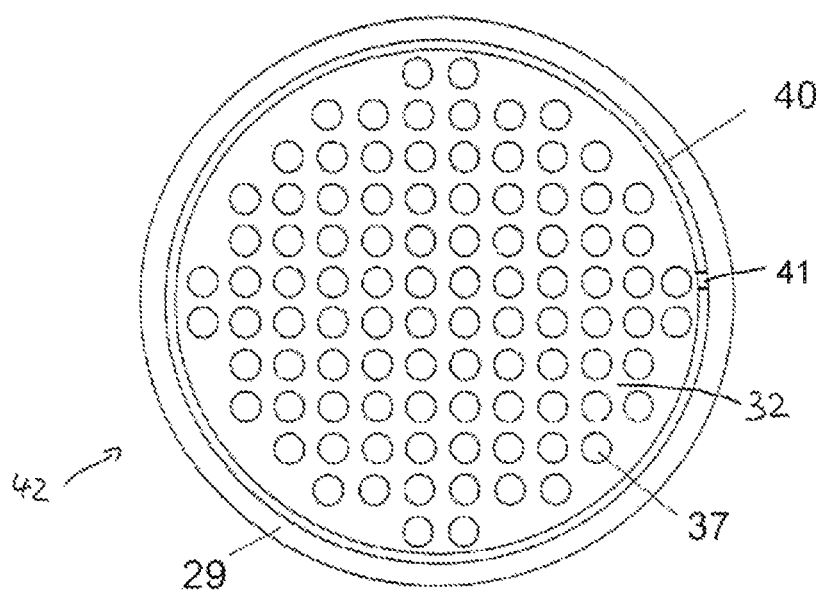

FIG. 12 shows a diagrammatic top view, not to scale, of the studded pressure plate 42, attached to the first pressure plate 29, with several studs 37 with a stud height H. The density of the studs 37 is kept very low in FIGS. 11 and 12 in order to increase clarity.

Preferably, the studded pressure plates 42, 42' in each case have at least 50, in particular regularly- and/or equally-distributed, studs 37, more preferably in each case at least 100, more preferably in each case at least 200, and more preferably in each case at least 400.

Figure 10:
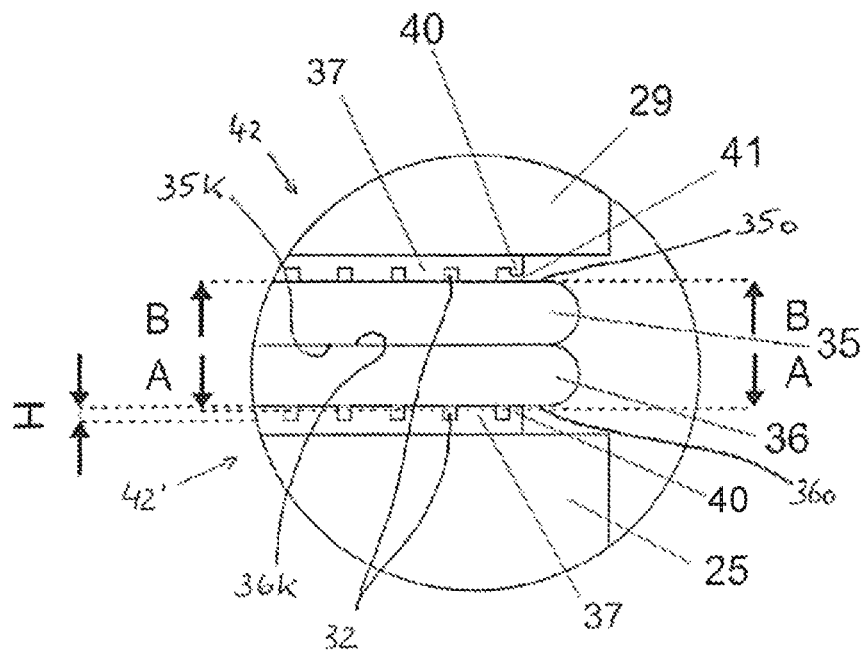

FIG. 11 shows a diagrammatic sectional view according to the line of intersection A-A of FIG. 10 with the second pressure plate 25 with the studded pressure plate 42'. In this depiction, it is recognized that the entire surface of the substrates 35, 36 does not rest on the studs 37, thereby the probability of the contamination of the substrates 35, 36 is reduced.

The separation distances A and B are reduced to zero, so that contact exists between heating surfaces 15, 19 of the studded pressure plates 42, 42' and the surfaces 35o, 36o.

| | List of Reference Symbols |
|---|---|
| 1 | Alignment system |
| 2 | Valves |
| 4, 4' | Vacuum transfer chamber |
| 5 | Vacuum transfer section |
| 6 | Bonding system |
| 6o | Chamber opening |
| 6s | Slot |
| 7 | Supporting structure |
| 8 | Positional actuator |
| 9 | Force actuator |
| 10 | Bonding chamber, in particular vacuum chamber |
| 11 | Attachments |
| 14 | Substrate stack |
| 15, 15' | First heating surface |
| 16 | Pump |
| 17 | Radiation heat |
| 18 | Receiving system, in particular substrate base |
| 19, 19' | Second heating surface |

-continued

| | List of Reference Symbols |
|---|---|
| 20 | Seals |
| 21 | Loading pins |
| 21p | Adjustment plate |
| 22 | Adjustment drive, in particular loading pin actuator |
| 23 | Supporting structure |
| 24 | Lock drive |
| 25 | Second pressure plate |
| 26 | Second, in particular lower, heating system |
| 27 | Valve |
| 28 | Lock seals |
| 29 | First pressure plate |
| 30 | First, in particular upper, heating system |
| 31 | Seals |
| 32 | Flow channels |
| 34 | Robot, in particular process robot |
| 35 | First, in particular upper, substrate |
| 35k | First contact surface |
| 35o | First surface |
| 36 | Second, in particular lower, substrate |
| 36k | Second contact surface |
| 36o | Second surface |
| 37 | Studs |
| 38, 38' | Unit, in particular vacuum cluster, preferably high-vacuum cluster |
| 39 | Locks |
| 40 | Arm |
| 41 | Passage |
| 42, 42' | Studded pressure plate |
| A | Separation distance |
| B | Separation distance |
| E | Base plane |
| H | Stud height |

Having described the invention, the following is claimed:

1. A bonding device for bonding a first substrate to a second substrate, the bonding device comprising:
a first chuck configured to hold the first substrate and/or apply pressure to the first substrate, the first chuck including a first surface configured to contact a substrate surface of the first substrate;
a second chuck configured to hold the second substrate and/or apply pressure to the second substrate, the second chuck including a second surface configured to contact a substrate surface of the second substrate, at least one of the first surface and the second surface being formed by a plurality of protrusions;
flow channels located between the protrusions of the least one of the first surface and the second surface;
a gas supply configured to introduce gas into the flow channels to provide convective and/or conductive heating; and
an arm bounding an entire radial peripheral area of the protrusions of the at least one of the first surface and the second surface, the arm including a passage configured to control leakage of an excess amount of the introduced gas from the flow channels.

2. The bonding device according to claim 1, wherein the second surface is formed by the protrusions, said second surface being less than 90% of the substrate surface of the second substrate.

3. The bonding device according to claim 1, wherein the flow channels have a depth of less than 1 mm relative to the first and/or second surfaces.

4. The bonding device according to claim 1, wherein the plurality of protrusions includes at least 50 of the protrusions.

5. The bonding device of claim 1, wherein the protrusions are equally-distributed.

6. The bonding device according to claim 1, wherein the first surface is formed by the plurality of protrusions, said first surface being less than 90% of the substrate surface of the first substrate.

7. The bonding device according to claim 1, wherein diameters of the first and second surfaces are respectively less than diameters of the first and second substrates.

* * * * *